United States Patent
Park

(10) Patent No.: US 6,835,277 B2
(45) Date of Patent: Dec. 28, 2004

(54) ASHING APPARATUS FOR SEMICONDUCTOR DEVICE

(75) Inventor: Min-O Park, Kyonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 210 days.

(21) Appl. No.: 10/134,734

(22) Filed: Apr. 30, 2002

(65) Prior Publication Data
US 2002/0189760 A1 Dec. 19, 2002

(30) Foreign Application Priority Data
Jun. 16, 2001 (KR) .................................. 2001-0034100

(51) Int. Cl.$^7$ .......................... H05H 1/00; C23C 16/00
(52) U.S. Cl. .......................... 156/345.33; 156/345.35; 118/723 ME
(58) Field of Search ................. 156/345.33, 345.35, 156/345.5; 118/723 ER, 723 IR, 723 MR, 620, 641

(56) References Cited

U.S. PATENT DOCUMENTS 4,687,544 A * 8/1987 Bersin ........................ 438/709
5,226,056 A * 7/1993 Kikuchi et al. ............... 373/18
6,013,155 A * 1/2000 McMillin et al. ...... 156/345.33
6,132,552 A * 10/2000 Donohoe et al. ...... 156/345.33

FOREIGN PATENT DOCUMENTS

JP  58184724 A  * 10/1983  ......... H01L/21/285
JP  08124909 A  *  5/1996  ......... H01L/21/3065

* cited by examiner

Primary Examiner—Parviz Hassanzadeh
(74) Attorney, Agent, or Firm—Volentine Francos & Whitt, PLLC

(57) ABSTRACT

An ashing apparatus for semiconductor wafers includes a reaction chamber, a plasma quartz that generates plasma ions, an ion ejector provided at a side wall of the reaction chamber and through which the plasma ions are ejected into the reaction chamber, a chamber upper cover of quartz through which light radiated from a halogen lamp is transmitted for ashing a wafer by heat of the light, and a distribution pipe coupled to the ion ejector and disposed within the reaction chamber that directly sprays the ions ejected from the ion ejector onto the wafer. The distribution pipe has a plurality of ejection holes formed along a circumference thereof and through which the plasma ions are ejected toward and uniformly sprayed on the wafer.

18 Claims, 5 Drawing Sheets

ASHING APPARATUS FOR SEMICONDUCTOR DEVICE

The present application claims priority under 35 U.S.C. §119 to Korean Application No. 2001-34100 filed on Jun. 16, 2001, which is hereby incorporated by reference in its entirety for all purposes.

BACKGROUND OF THE INVENTION

1. Field of the Invention

The present invention relates to an ashing apparatus for a semiconductor device, and more particularly, to an ashing apparatus by which ionized gases are poured into a chamber provided in a dry etching equipment and are uniformly diffused on wafers through ring-shaped pipes.

2. Description of the Related Art

Generally, semiconductor devices can be fabricated by combination of a great number of processes such as the formation of a thin film on a wafer, patterning of a thin film, a washing process, and the like. A process in which a photoresist remaining on a wafer after an etch process is removed is called an ashing process. The ashing process may be called a P/R strip process, which is a type of dry etch process.

In a common dry etching process, gases poured into a reaction chamber are changed into a plasma state by an electrical action such as a discharge, and wafers are etched by the plasma. In contrast, in an ashing process, ionized plasma only is selected from the whole plasma of reactive gases and ashing is performed by the ionized plasma, i.e., ion components. In such an ashing process, the ion components are created outside of a reaction chamber, and are guided into the internal portion of the chamber. An ashing process can be classified into multi-type and single-type ashing processes, according to the way the wafers are arranged to be processed in a chamber. The multi-type ashing process commonly includes accumulating and processing the wafers in batches.

FIG. 1 illustrates a conventional single-type process ashing apparatus, which will be briefly.explained as follows. In the single-type process semiconductor ashing apparatus, ions are injected into the reaction chamber 10 through an ion inlet (ion ejector)11, as shown in FIG. 1. Such an injection method is similar to the method in a multi-type process ashing apparatus, by which ions are created outside of the chamber and are injected into the chamber. That is, the ion inlet (ion ejector) 11 serves to guide only ion components out of plasma made in plasma quartz PQ, into chamber 10. The plasma is generated in the quartz that is placed outside of the chamber by a radio frequency power source (RF power source). The ions introduced into the chamber 10 flow through a gas diffuser plate 20 (GDP) which is formed with numerous through holes 21 and which serves to divide the internal space of the chamber into two spaces, i.e., the upper and lower spaces.

The GDP 20 is commonly made of quartz. The ions that pass through the GDP 20 are sprayed on a wafer 30 that is placed on the stage 40 in a lower side or space of the chamber 10. That is, the ions are injected into the reaction chamber 10 through the ion ejector 11, and the ions that pass through the ion ejector 11 are again passed through the GDP 20, thereby being sprayed on a wafer 30. At this time, the ions are uniformly sprayed on the wafer 30 due to the uniformly formed through holes 21.

The reason that the ion ejector 11 is formed at a sidewall of the chamber will be briefly explained as follows. In an ashing process, photoresist on a wafer should be in a softened state, so that ions properly react with the photoresist as well as the wafer. A hardened photoresist on the wafer will react weakly with ions, so that ashing cannot be effectively performed. Therefore, in order to make the photoresist soft, it is necessary to heat the photoresist at a predetermined temperature. To heat only the photoresist without affecting any other adjacent objects, a halogen lamp (not shown) is employed to heat the photoresist. The halogen lamp radiates light and the light serves to heat the photoresist on the wafer in the chamber. That is, the light radiated from the halogen lamp passes through the upper cover 12 formed of quartz and illuminates the inside of the chamber 10. The light is also radiated onto the wafer 30 after passing through the GDP 20, which is also made of quartz. As a result, the light serves to heat the photoresist on the wafer 30 due to the heat energy of the light, thereby softening the photoresist.

In such an environment, in order for the wafer to be directly contacted with the light radiated from the halogen lamp that is provided over the cover 12, intervening objects cannot be provided between the cover 12 and the wafer 30. For this reason, the ion ejector 11 through which the ions are passed should be formed at the sidewall of chamber 10, as shown in FIG. 1. However, there is a problem in such an apparatus in that since ions are injected into chamber 10 through ion ejector 11 provided at a sidewall of chamber 10, the portion of GDP 20 adjacent to the ion ejector 11 is provided with a relatively greater number of ions than a portion of GDP 20 that is placed far from the ion ejector 11. The ions passed through GDP 20 in such an environment cannot be uniformly distributed on a wafer.

In other words, a portion of wafer 30 nearer to the ion ejector 11 is provided with a relatively large amount of ions, as illustrated in FIG. 2. However, a portion of wafer 30 that is placed far from the ion ejector 11 is provided with a relatively small amount of ions. As a result, the distribution of ions on the wafer is not uniform, thereby causing the problem that ashing efficiency of a wafer decreases.

Particularly, there is also a problem that since the light radiated from the halogen lamp is transmitted both through the upper cover 12 made of quartz and the GDP 20 made of quartz, the transmissivity of light decreases. As a result, the heating rate of the photoresist by the transmitted light in chamber 10 accordingly decreases.

SUMMARY OF THE INVENTION

The present invention is therefore directed to an ashing apparatus which substantially overcomes one or more of the problems due to the limitations and disadvantages of the related art.

To solve the above noted problems, it is an object of the present invention to provide an ashing apparatus by which ions can be uniformly sprayed onto a wafer in a chamber through a ring shaped distribution pipe, thereby increasing ashing uniformity of a wafer.

It is another object of the present invention to provide an ashing apparatus in which light radiated from a halogen lamp can be transmitted through an upper cover only, to directly illuminate a wafer, thereby increasing heating efficiency and raising ashing efficiency of a wafer.

In order to achieve these objects, there is provided an ashing apparatus which includes a chamber; a plasma quartz in which plasma ions are generated; an inlet provided at a sidewall of the chamber through which the plasma ions are ejected into the chamber; a chamber upper cover made of quartz, through which light radiated from a halogen lamp is transmitted for ashing a wafer by heat of the light; and a ring shaped distribution pipe, coupled to the inlet and disposed along a circumference of an interior of the chamber, the ring shaped distribution pipe having a plurality of distribution holes through which the ions are directly sprayed onto the wafer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
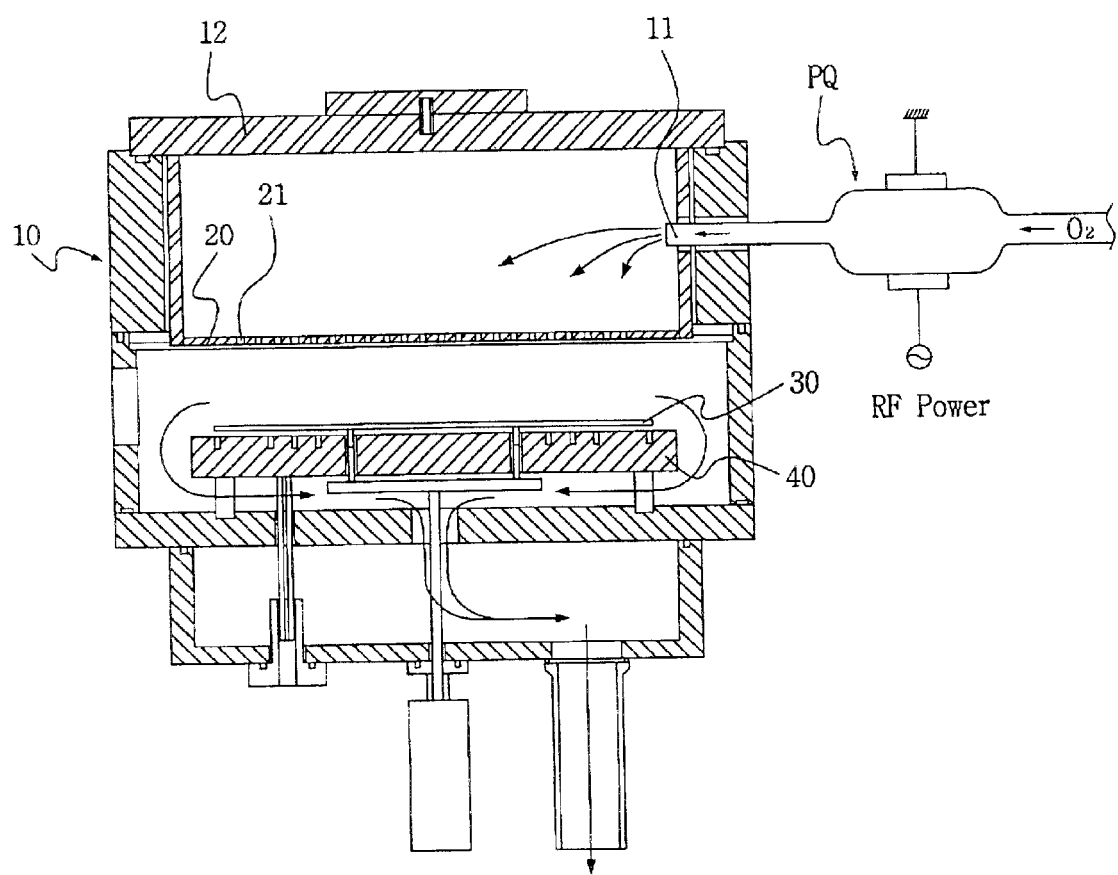
FIG. 1 is a cross-sectional view showing the structure of a conventional ashing apparatus.
Figure 2:
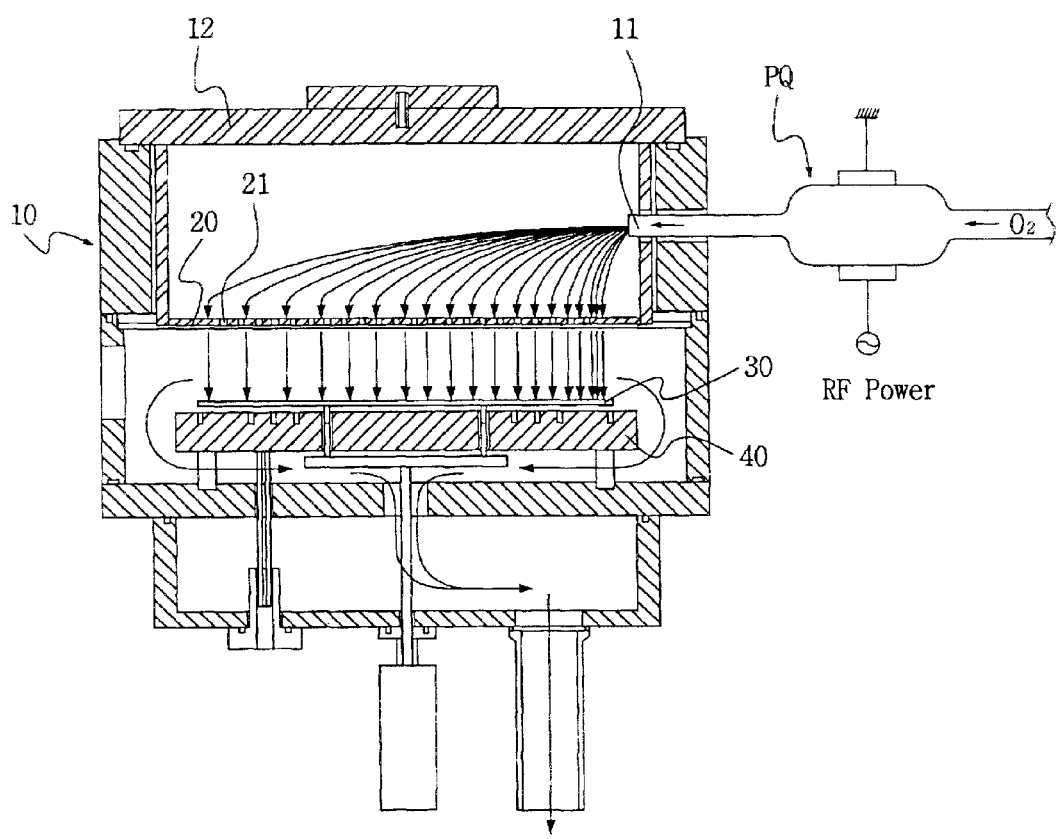
FIG. 2 is a cross-sectional view illustrating the ejection mechanism of ions into a chamber by the conventional ashing apparatus shown in FIG. 1.

Hereinafter, the present invention will be described in detail with reference to the accompanying drawings. It should be noted that like reference numerals are used throughout the accompanying drawings for designation of like or equivalent parts or portions, for simplicity of illustration and explanation. Also, in the following description, specifications will be made to provide a thorough understanding about the present invention. It should be apparent to one skilled in the art that the present invention can be achieved without these particular specifications. There will be omission of detailed description about well known functions and structures to clarify key points of the present invention.

Figure 3:
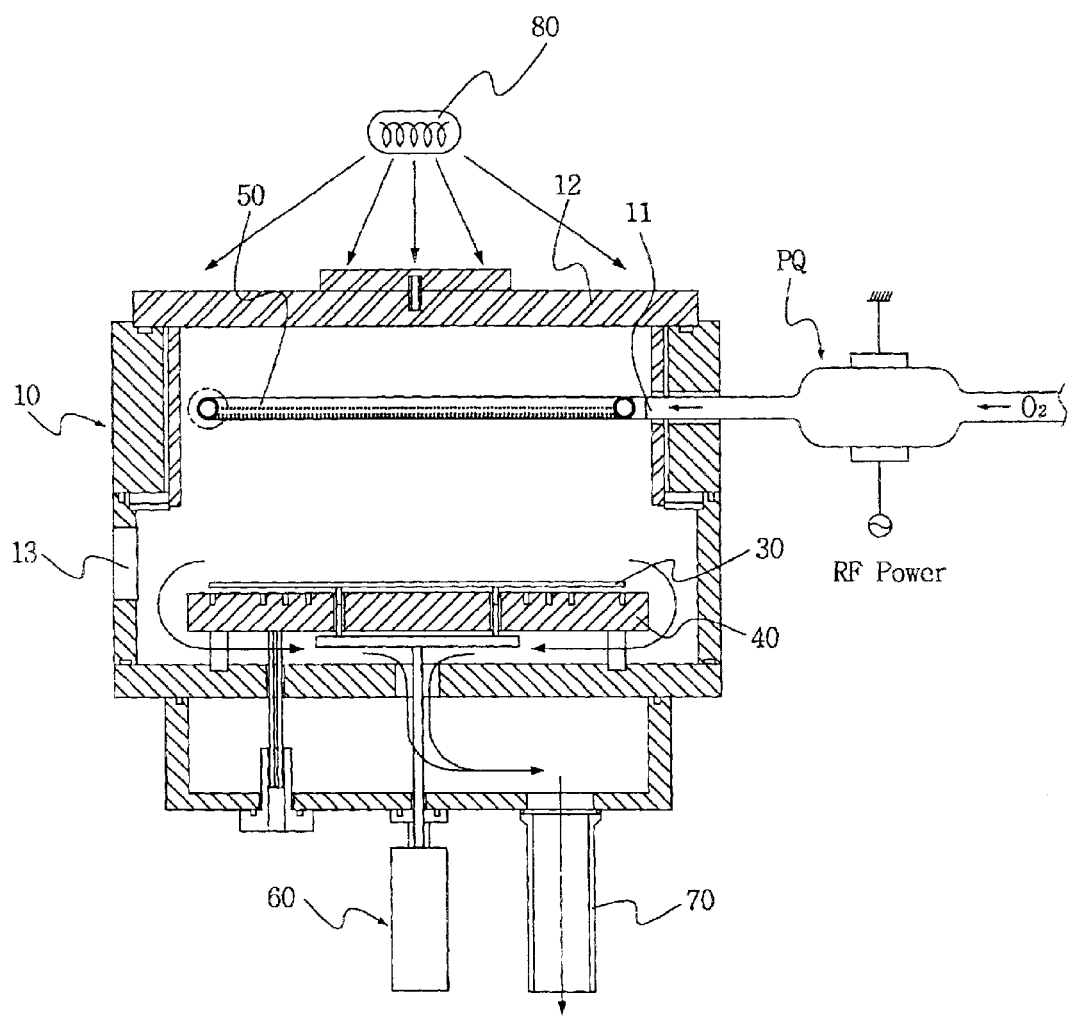
FIG. 3 is a cross-sectional view of an ashing apparatus according to the present invention.

As shown in FIG. 3, the structure of the ashing apparatus of present invention is similar to that of the conventional ashing apparatus. The reaction chamber 10 is formed at one side of an ion ejector 11, through which ions flow into the chamber. The upper portion of reaction chamber 10 is covered by an upper cover 12 made of quartz. The reaction chamber 10 is divided into two spaces, e.g., an upper space into which ions are ejected and a lower space in which a stage 40 for chucking a wafer 30 is provided. The wafer 30 is loaded through the door 13 at one side of the chamber and placed on the stage 40. The reaction chamber 10 is internally at a vacuum state. Also, wafer 30 is adhered to stage 40 by vacuum pressure.

Halogen lamp 80 is provided over the upper cover 12 covering the reaction chamber 10 and radiates light to soften the photoresist. Light radiated from halogen lamp 80 is transmitted through the transparent upper cover 12 to illuminate the wafer 30, so that photoresist on the wafer 30 is heated at a predetermined temperature by the light energy.

In the conventional ashing apparatus as illustrated in FIG. 1, a gas diffuser plate (GDP) was provided between the upper space of chamber 10 in which ions are ejected and the lower space of chamber 10 in which a wafer is positioned.

In contrast, in the ashing apparatus of the present invention as illustrated in FIG. 3, a GDP is not constructed in chamber 10. Instead of having a GDP, the ashing apparatus of the present invention includes ring shaped distribution pipe 50 in the interior of chamber 10. That is, the ring shaped distribution pipe 50 is disposed along the interior wall surfaces of chamber 10. The ring shaped distribution pipe 50 is coupled to the ion ejector 11 in the interior of the chamber 10.

Figure 3A:
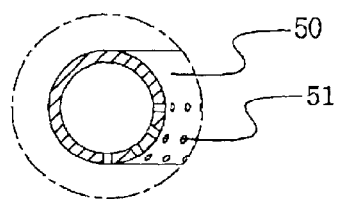
FIG. 3A illustrates a cross section of the distribution pipe.
Figure 4:
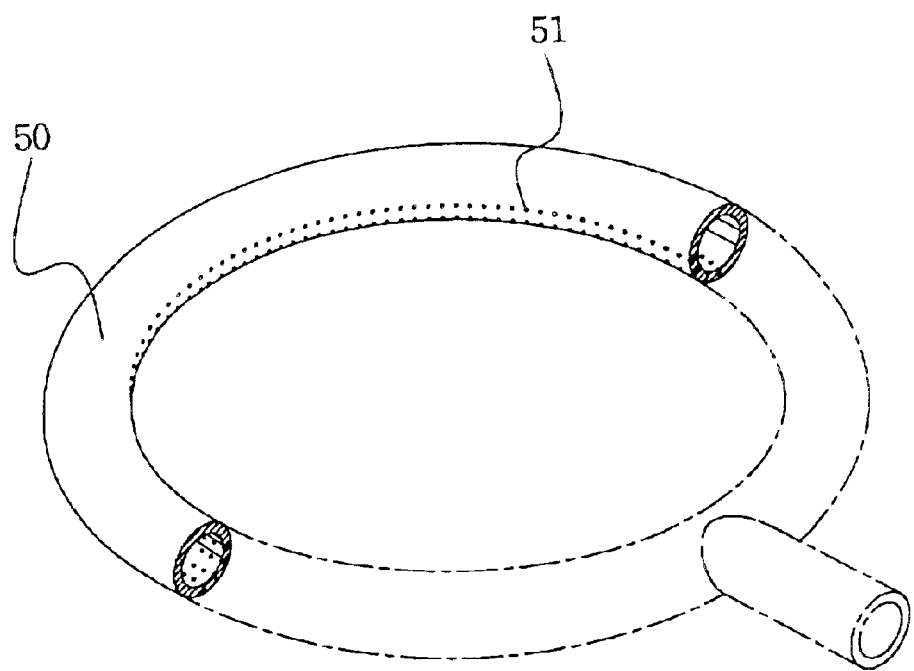
FIG. 4 is a perspective view showing a distribution pipe according to the present invention.

As shown in FIG. 4, ring shaped distribution pipe 50 has a circular cross section and is formed in a ring shape. The ring shaped distribution pipe 50 is formed as having ejection holes 51 along an inner side thereof and along a lower bottom portion thereof. Also, the ring shaped distribution pipe 50 may be formed as including plural ejection holes disposed in the vertical direction, concentrically around the inner side thereof, as shown in FIG. 3A. Since the ejection holes 51 are formed along an inner side and a lower side of the ring shaped distribution pipe 50 along the circumference thereof, ions are uniformly sprayed on wafer 30 of FIG. 3 in all directions from the ring shaped distribution pipe 50.

As described, the ring shaped distribution pipe 50 may include a great number of ejection holes 51 formed along the circumference thereof and in a vertical direction, spaced apart from each other. The ring shaped distribution pipe 50 may be made of quartz, or any other suitable transparent material. The ejection holes 51 as formed along a vertical line concentrically on an inner side of the ring shaped distribution pipe 50 eject the ions at different angles from the distribution pipe, to uniformly spray the wafer from the edge portion thereof to a center portion thereof. For instance, the upper most ejection holes 51 in the vertical direction have ejection angles to direct the ions toward a center of wafer 30.

Figure 5:
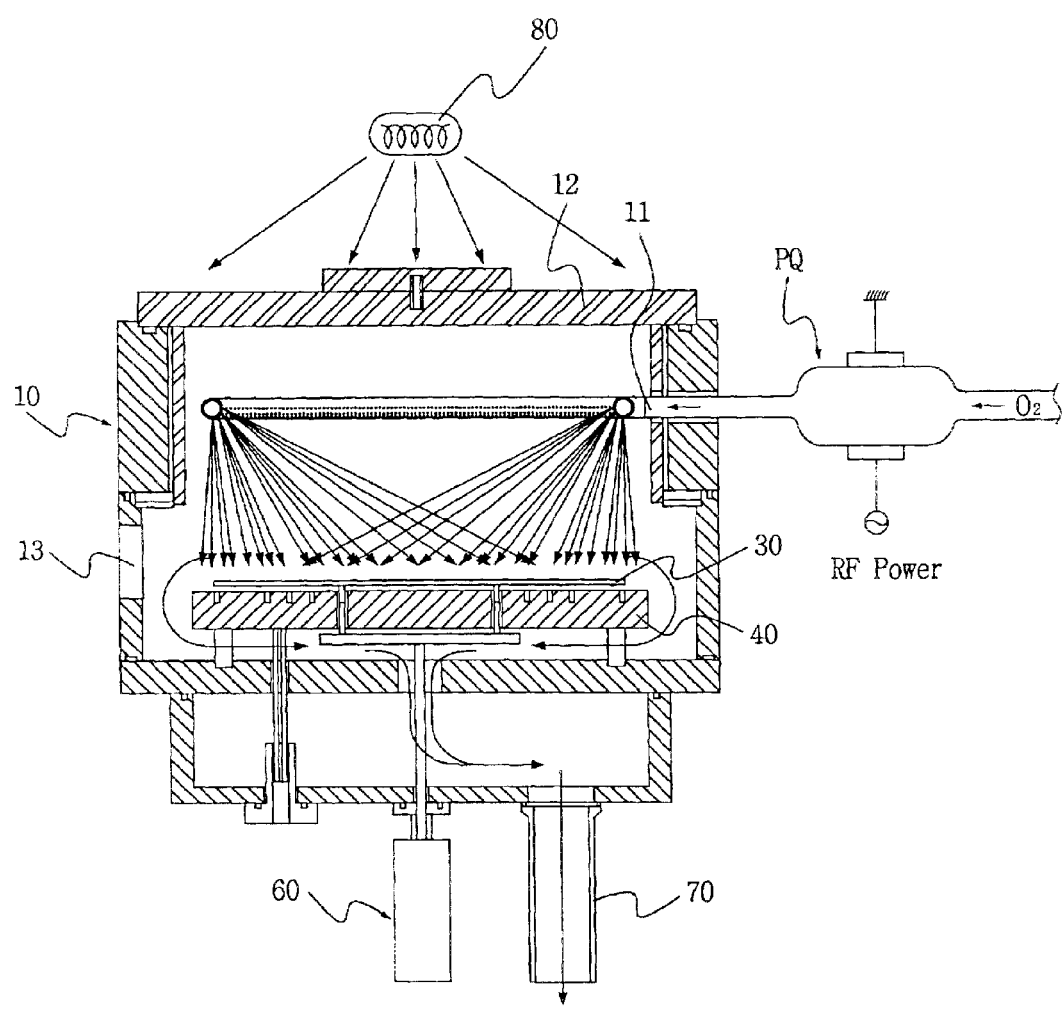
FIG. 5 is a cross-sectional view illustrating the ejection mechanism of ions in the ashing apparatus of the present invention.

In the ashing apparatus according to the present invention, since a GDP is not provided in reaction chamber 10 and since wafer 30 is nearly entirely opened to transparent upper cover 12 in the vertical direction with only the ring shaped distribution pipe 50 therebetween, light radiated from halogen lamp 80 is transmitted only through the transparent upper cover 12 to reach wafer 30, as may be understood in view of FIG. 5. Accordingly the photoresist is more quickly heated than in the conventional ashing apparatus.

As further illustrated in FIGS. 3 and 5, lifting apparatus 60 lifts wafer 30, and discharging line 70 discharges a reactive gas from reaction chamber 10.

The operation of the ashing apparatus according to the present invention is explained as follows with reference to FIG. 5. In a similar manner as in the conventional ashing apparatus, ions are ejected into the ring shaped distribution pipe 50 provided in reaction chamber 10 through the ion ejector 11. At this time, the ions ejected from the ion ejector 11 are uniformly distributed in the ring shaped distribution pipe 50 and sprayed on wafer 30 through the ejection holes 51 by ejection pressure. Since the ejection holes 51 formed in the ring shaped distribution pipe 50 are spaced apart from one another with a certain distance therebetween and arranged along a vertical line with different ejection angles, the ions can be ejected from the ejection holes 51 in all directions to be uniformly sprayed on wafer 30. In addition, since the ejection holes 51 are uniformly distributed along the entirety of the inner circumference and the bottom of ring shaped distribution pipe 50, and thus positioned over the entire periphery of wafer 30, the ions can be uniformly sprayed on wafer 30 irrespective of the distance between wafer 30 and the ion ejector 11.

As described above, according to the present invention, there is an advantage in that since light radiated from halogen lamp 80 is transmitted only through the transparent upper cover 12, and not also through a GDP, the light effectively illuminates wafer 30 to efficiently heat and thus soften the photoresist.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An ashing apparatus for semiconductor wafers, comprising:
    a reaction chamber;
    a wafer stage disposed in a lower portion of the chamber so as to support a wafer thereon;
    a plasma generator that generates plasma ions;
    an ion ejector, coupled to the plasma generator and extending through a side wall of the reaction chamber, through which the plasma ions are ejected into the reaction chamber;
    a chamber upper cover transparent to halogen light so that light radiated from a halogen lamp can be transmitted therethrough; and
    an annular distribution pipe coupled to the ion ejector and disposed within the reaction chamber above said wafer stage, the distribution pipe having a lowermost portion facing in a downward direction towards the wafer stage, a radially innermost portion circumscribing an open area through which light can be transmitted through said cover and onto a wafer supported on the wafer stage, and a plurality of ejection holes extending radially therethrough at locations between said lowermost and radially innermost portions thereof, some of said ejection holes being spaced from each other in a direction along the length of said annular distribution pipe, and some of said ejection holes being spaced from each other in the circumferential direction of the cross section of said pipe, wherein said ejection holes are open directly to the interior of said reaction chamber, and are oriented at such different angles that plasma ions fed into said pipe from said plasma generator are sprayed through the holes directly toward and uniformly onto a wafer supported on the wafer stage.

2. The ashing apparatus of claim 1, wherein the distribution pipe has a circular cross section.

3. The ashing apparatus of claim 1, wherein uppermost ones of said ejection holes extend through the radially innermost portion of said distribution pipe so as to be directed toward a center of the wafer stage.

4. The ashing apparatus of claim 3, wherein lowermost ones of the ejection holes of said distribution pipe extend through the lowermost portion of said distribution pipe so as to be directed toward an outer peripheral portion of the wafer stage.

5. The ashing apparatus of claim 4, wherein intermediate ones of the ejection holes of said distribution pipe extend through the distribution pipe at vertical locations between the lowermost ones of the ejection holes and the uppermost ones of the ejection holes.

6. The ashing apparatus of claim 1, wherein the distribution pipe is quartz.

7. The ashing apparatus of claim 1, wherein the chamber upper cover is quartz.

8. The ashing apparatus of claim 1, wherein the distribution pipe is disposed along interior wall surfaces of the reaction chamber.

9. The ashing apparatus of claim 1, wherein no part of the ashing apparatus is located within a projection of said open area from said cover to said wafer stage.

10. An ashing apparatus comprising:
    a reaction chamber having a side;
    a wafer stage disposed in a lower portion of the chamber so as to support a wafer thereon;
    a chamber upper cover that is transparent to halogen light;
    an inlet provided through said side wall of the reaction chamber;
    a halogen lamp that radiates light through the upper chamber cover into the reaction chamber and onto the wafer; and
    an annular distribution pipe coupled to the inlet and disposed within the reaction chamber above said wafer stage, the distribution pipe having a lowermost portion facing in a downward direction towards the wafer stage, a radially innermost portion circumscribing an open area through which light can be transmitted by said halogen lamp through said cover and onto a wafer supported on the wafer stage, and a plurality of ejection holes extending radially therethrough at locations between said lowermost and radially innermost portions thereof, some of said ejection holes being spaced from each other in a direction along the length of said annular distribution pipe, and some of said ejection holes being spaced from each other in the circumferential direction of the cross section of said pipe, wherein said ejection holes are open directly to the interior of said reaction chamber, and are oriented at different angles toward a wafer supported on the wafer stage.

11. The ashing apparatus of claim 10, wherein uppermost ones of said ejection holes extend through the radially innermost portion of said distribution pipe so as to be directed toward a center of the wafer stage.

12. The ashing apparatus of claim 11, wherein lowermost ones of the ejection holes of said distribution pipe extend through the lowermost portion of said distribution pipe so as to be directed toward an outer peripheral portion of the wafer stage.

13. The ashing apparatus of claim 12, wherein intermediate ones of the ejection holes of said distribution pipe extend through the distribution pipe at vertical locations between the lowermost ones of the ejection holes and the uppermost ones of the ejection holes.

14. The ashing apparatus of claim 10, wherein the chamber upper cover is quartz.

15. The ashing apparatus of claim 10, wherein the distribution pipe is quartz.

16. The ashing apparatus of claim 10, wherein the distribution pipe has a circular cross section.

17. The ashing apparatus of claim 10, wherein the distribution pipe is disposed along interior surfaces of the side wall of the reaction chamber.

18. The ashing apparatus of claim 10, wherein no part of the ashing apparatus is located within a projection of said open area from said cover to said wafer stage.

* * * * *